United States Patent [19]

Auer, Jr. et al.

[11] 4,168,526
[45] Sep. 18, 1979

[54] DIGITAL CIRCUIT GENERATING A VITAL RELAY

[75] Inventors: John H. Auer, Jr., Fairport; David B. Rutherford, Rochester, both of N.Y.

[73] Assignee: General Signal Corporation, Stamford, Conn.

[21] Appl. No.: 882,688

[22] Filed: Mar. 2, 1978

[51] Int. Cl.² .............................................. G06F 15/20
[52] U.S. Cl. .................................. 364/569; 328/129; 364/200; 364/484
[58] Field of Search ............... 364/200, 484, 569, 701, 364/900; 307/233 R; 328/129, 131, 138; 235/303.1

[56] References Cited

U.S. PATENT DOCUMENTS

| | | | |
|---|---|---|---|
| 4,044,272 | 8/1977 | Darrow | 328/129 X |
| 4,072,852 | 2/1978 | Hogan et al. | 235/303.1 |

Primary Examiner—Jerry Smith
Attorney, Agent, or Firm—Pollock, Vande Sande & Priddy

[57] ABSTRACT

A microprocessor based vital delay circuit is provided which is arranged to emit an output no less than a predetermined time after an input stimulus. The predetermined time, which corresponds to the delay, is controlled by selecting the relationship between two quantities. A digital processor performs a series of computations on the two quantities, each computation is arranged to take unit time and by selecting the proper relationship between the two quantities, the total series of computations takes a predetermined amount of time. Before the output is allowed to occur, several checks are performed to insure that no hardware or software failures have erroneously generated the result. One novel checking technique insures that the clock frequency has not changed, and this technique is applicable to a wide variety of devices in which digital techniques are employed.

21 Claims, 9 Drawing Figures

DIGITAL CIRCUIT GENERATING A VITAL RELAY

FIELD OF THE INVENTION

The present invention relates to a vital timer, a device which produces an output signal no less than a predetermined selectable time after an input stimulus.

BACKGROUND OF THE INVENTION

Prior art techniques provide a variety of forms of timers or delay circuits in which an output is produced a selected time after an input stimulus. Typically, these prior art devices employ one of two technologies. In one device, the time delay is measured with the aid of an electro-mechanical motor driven timer. The other technology which has been employed to produce delay in devices is analog circuitry in which usually a capacitor is charged up to some target voltage, and the charging process takes a controllable amount of time which corresponds to the delay.

A subset of the applications for timers requires not only practical devices, but devices which exhibit fail-safe or vital characteristics in that they will not, except under very unusual circumstances, provide a time delay less than the selected time delay. Almost universally, the motor driven timer technology is employed in this subset of the field. A vital timer employing analog techniques is disclosed and claimed in the application of Auer et al, filed Jan. 30, 1978, (GR-424), Ser. No. 874,007, entitled "Fail-Safe Time Delay Circuit."

However, digital techniques and in particular, microprocessor devices, have characteristics which make them attractive as the timing element in a delay circuit. For one thing, the microprocessor is capable of accurately timing long intervals. Timing loops can be constructed with selected instruction steps and arranged to take a definite number of clock counts. Although the clock counts are at relatively high frequencies, since the processor can keep track of large numbers easily, accurate timing of even long intervals is possible. In contrast, analog techniques, when timing relatively long intervals, require threshold detection at levels which have inherently large setability tolerance. For example, an analog device with relatively good repeatability of ±1% will, in timing an 8 minute interval, provide time delays that vary over almost 10 seconds. On the other hand, digital techniques, if employed, would be expected to have timing repeatability which is not a function of the period being timed. For example, a reasonable goal appears to be ±½ second and thus, in timing out large intervals, would exhibit much better repeatability than the analog device.

However, especially when a vital or fail-safe characteristic is required, checking techniques must be employed to insure that the microprocessor has actually executed the program steps required as a prerequisite to insuring that the desired delay is actually exired before outputting a signal. In addition, since the delay will be a function of a certain number of clock counts, it is also important to be able to check the accuracy of the microprocessor clock, i.e., to guard against clock drift reducing the actual delay below the desired delay.

It is therefore one object of the present invention to provide a digital delay circuit which exhibits vital or fail-safe characteristics. It is another object of the invention to provide such a circuit which includes, as a major component thereof, a conventional microprocessor. It is yet another object of the present invention to provide a vital or fail-safe time delay circuit including a microprocessor as a major component thereof in which the instruction steps which direct the microprocessor to time out the desired delay, include several instruction steps which act to check the proper operation of the microprocessor. It is a further object of the present invention to provide a circuit of the foregoing type which further includes apparatus specifically arranged to monitor the proper operation of the microprocessor clock which apparatus is capable of suppressing an output signal in the event that the microprocessor clock drifts beyond a predetermined range from its nominal frequency. It is another object of the present invention to provide apparatus for checking the proper operation of a microprocessor clock to insure that the microprocessor output is not employed by any utilization circuits unless the microprocessor clock is operating within a desired tolerance of its nominal frequency.

SUMMARY OF THE INVENTION

The present invention meets these and other objects of the invention by providing a microprocessor which is arranged to be initiated by a stimulus and which produces an output no less than a predetermined, selectable time after the stimulus. Input means are provided, which responds to the stimulus to load a pair of quantities into registers in the processor. Program responsive means are included to perform a series of computations on the input quantities to produce a third quantity. The program responsive means includes means for consuming a unit amount of time for each of a series of computations and for terminating the computations after a number of computations which are related to the input quantities, thereby allowing the time consumed in the computation to be varied by varying the input quantities to provide for a selectable delay. Output means are also provided for outputting a signal which alternates between two potential levels at a rate determined by the third quantity. Finally, rate checking means are provided for comparing the rate of the signal produced by the output means with a checking rate for energizing a load if, and only if, the rates have a predetermined relationship, to insure the clock frequency drift does not produce an output within the predetermined desired delay.

Another aspect of the invention comprises checking apparatus for verifying proper clock frequency of a processor which is particularly useful in checking operation of a microprocessor. In accordance with this aspect of the invention, a processor is driven by a clock and includes output means to generate a signal with a frequency related to the clock frequency which signal alternates between two potential levels. A potential responsive deivce is coupled to the signal and includes switching means operated to make or break a circuit to a selected potential dependent upon the signal. Checking means are included for generating a checking signal with a predetermined frequency alternating between two potential levels. Capacitor means are coupled between the switching means and the means for generating a checking signal and a dc load is coupled to the switching means. The result of this apparatus is a pulsating direct current is delivered to the load with the period of the direct current pulses related to the difference between the clock frequency and the predetermined frequency. When the processor clock is operating properly, the difference between the two frequencies will be relatively small and thus the pulsating dc will have a large period, sufficient for it to energize a neutral relay which may comprise the load. On the other hand, if the processor clock has drifted too far from its nominal operating frequency, the difference between the two output frequencies will be so large and the corresponding period of the pulsating direct current so small that an output relay will not be energized.

BRIEF DESCRIPTION OF THE DRAWINGS

The present invention will now be explained in more detail in connection with the following portion of this specification when taken in conjunction with the attached drawings in which.

DETAILED DESCRIPTION OF PREFERRED EMBODIMENTS

Figure 1:
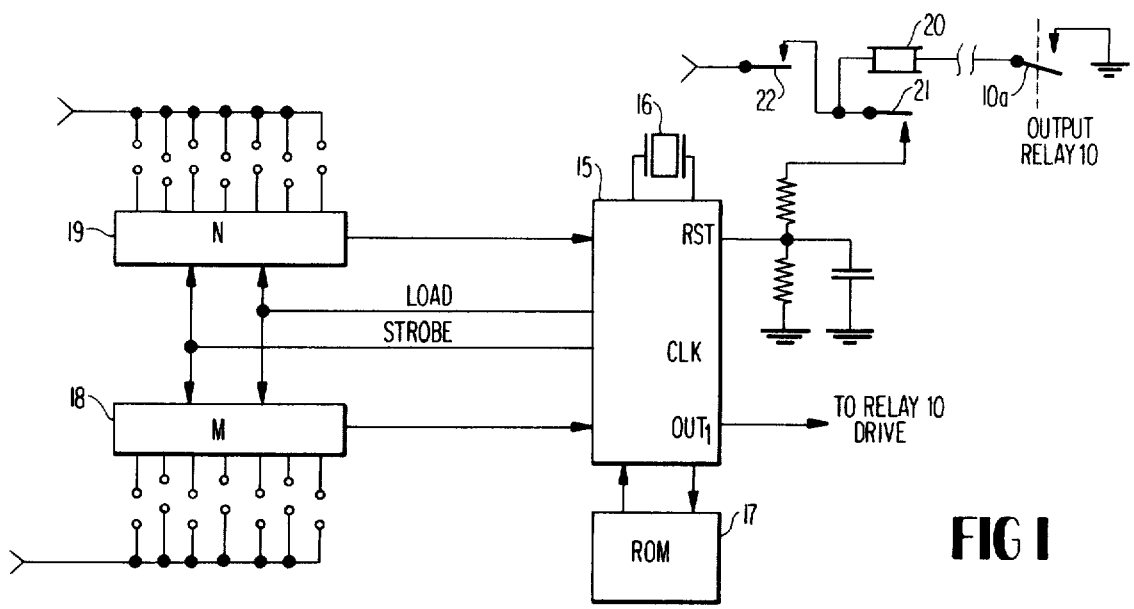
FIG. 1 is a block diagram of the delay device for producing an output signal a predetermined time after an input stimulus.

FIG. 1 shows a block diagram of a portion of the inventive digital delay circuit and further illustrates a manner of applying the delay for a useful purpose.

As shown in FIG. 1, a circuit to a relay 20 is partially completed from a positive source of energy through a switch 22 (which may be the front contact of another relay—not illustrated) through the relay 20 and thence through a front contact 10a of an output relay 10 to ground. Typically, it is desired to energize the relay 20 a predetermined time, and no less than that predetermined time, after the switch 22 is closed. To perform this function, the switch 22 is also connected to a back contact 21 of the relay 20 to the reset input terminal of a microprocessor 15. As illustrated, the microprocessor 15 is driven by a clock whose frequency is controlled by the crystal 16. Coupled to the microprocessor 15 is a read-only memory 17 which is employed to store the program under which the microprocessor 15 will be operated. The microprocessor 15 has a data input from registers 18 and 19 to load data to registers of the processor. The quantity stored in the registers 18 and 19 (M and N, respectively) is determined by selectively shorting jumpers to the inputs of the registers 18 and 19. The microprocessor 15 also includes an output terminal (OUT) which is connected to drive a relay 10. Desirably, the relay 10 is energized after, and only after, the predetermined time to provide an energization path for the relay 20. In operation, when switch 22 is closed (representing the input stimulus) the microprocess is initiated and, after a predetermined delay, determined by the relationship between the quantities M and N, an output signal is provided to drive the relay 10. If the output signal is of the proper form, the relay 10 picks, closing its front contact 10a, energizing relay 20 (which is the desired end result). To insure the time delay between closing switch 22 and picking of relay 20 is at least equal to the desired delay, the microprocessor, when energized, initializes its internal registers and selects the address of the beginning of the instruction program in the memory 17. The two numbers M and N are read serially by the processor 15.

The microprocessor 15 then enters a portion of the program of instructions which includes a timing loop, and an arithmetic or logic instruction or instructions, the execution of which takes a unit amount of time. Each time the loop is completed, an arithmetic or logic operation is performed on the quantities N and M. After the required number of timing loops have been performed, the result of the arithmetic or logical operations will be the production of a number Q which is then passed to an output routine. Production of the correct result Q can only take place by traversing the timing loop the required number of times corresponding to the desired delay. The output routine produces a voltage waveform at the output pin 1, the frequency of which is determined by two factors, the number Q and the frequency of the clock driving the processor.

The output waveform is employed to pick the relay 10, the result of which has already been explained. The time delay between initializing the processor 15 and picking the relay 10 is the desired time delay, and it is produced by causing the processor to execute a program loop a predetermined number of times, each loop requiring a predetermined number of clock cycles. Assuming that the microprocessor clock is operating at or near its nominal frequency, the total delay is the required delay.

To determine that the microprocessor has actually executed the program loop the desired number of times, the number Q must be checked, and can be checked since the frequency of the output waveform is related to Q. To this end, a divider or counter is driven by the microprocessor clock and is arranged to divide the clock frequency by the proper amount so that the divider output frequency bears a specified relationship with the output waveform frequency. When the specified relationship is detected, the output relay 10 can be picked.

Figure 2:
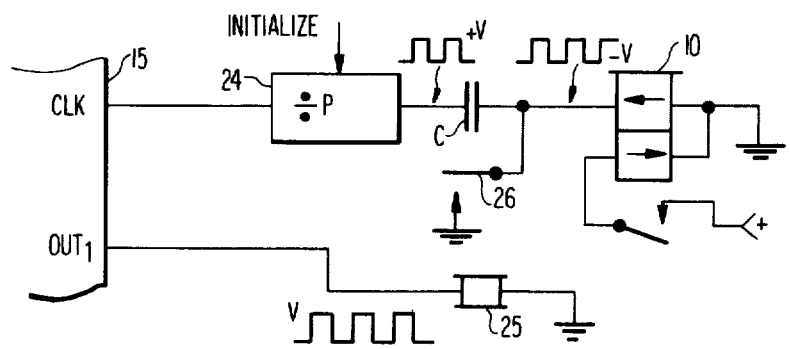
FIGS. 2 and 3 are two alternate embodiments for the microprocessor clock checking circuitry.

The manner in which the number Q is checked is diagrammatically shown in FIG. 2. As shown there, the pin 1 output of the microprocessor is provided to a relay 25 having a contact 26. When the relay is de-energized, the contact 26 is grounded through its back contact. Contact 26 is coupled to one terminal of the relay 10, whose other terminal is grounded, and also to one terminal of a capacitor C. The other terminal of the capacitor C is provided with the output from a divider 24. The divider 24 divides the processor clock by the quantity P. Relay 10 may be a biased neutral relay which requires a negative direct current to pick the same. The negative direct current is obtained by synchronously rectifying the alternating current output of the capacitor C. One possible relationship to produce this result is obtained when the frequencies of the pin 1 output and the output of the divider P are identical, and 180° out of phase. The resulting waveform will have a negative dc bias which, after the approximately 300 msec. required to pick the relay, will result in energization of the relay.

Processor 15 is a conventional microprocessor and therefore the number Q would be determined by the 8 bit result of the arithmetic or logical computations. Therefore, the chances of spuriously generating the number Q improperly are one of 256.

However, the relay 10 may be picked when the two frequencies, although not identical, are very close. For example, if the frequencies differ by 1 Hz., the output of the capacitor C will comprise a 1 Hz. beat frequency.

Figure 6:
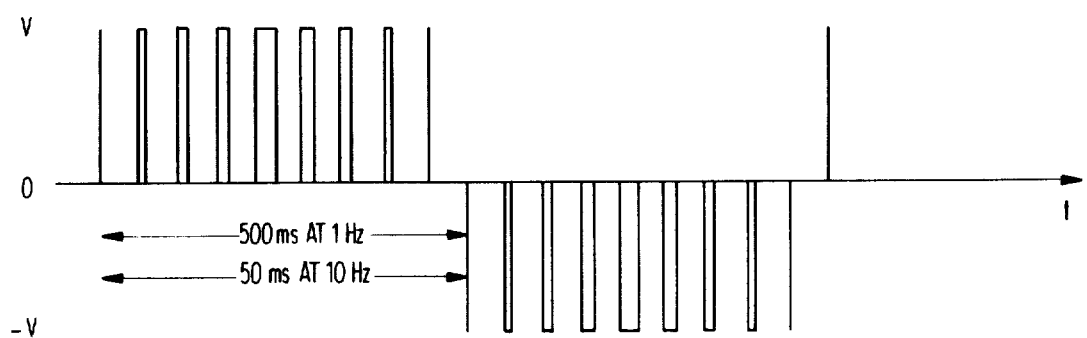
FIG. 6 is a representation of a waveform produced at the output of the clock checking circuitry.

Under those conditions, FIG. 6 illustrates the output available at the capacitor C wherein groups of positive and negative pulses alternate, each group lasting for 500 msec. Since the period of negative pulse (500 msec.) is greater than the 300 msec. required to pick the relay, the relay would be picked under these conditions as well. Desirably, this condition is avoided since it merely increases the probability that the processor 15 will produce a waveform under spurious conditions which will result in energization of the relay 10. An effective technique for minimizing this possibility is to arrange the processor output routine such that the output frequency is a function of 10Q and not Q. Accordingly, if the number Q produced is 1 away from the nominal Q, the output frequency will be 10 Hz. from the nominal and would therefore preclude energizing the relay.

Figure 3:
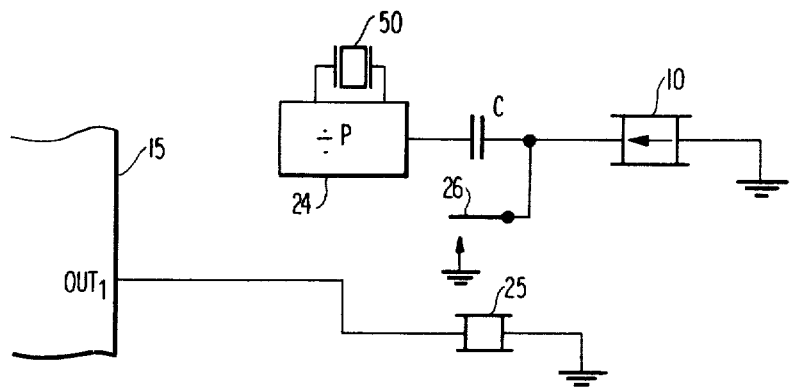

The foregoing apparatus is effective so long as the microprocessor clock is not spuriously increased in frequency. To check the operation of the clock, the apparatus shown in FIG. 3 is employed, rather than that shown in FIG. 2. As shown there, the output waveform at pin 1 is applied to the same relay 25. However, instead of driving the divider 24 by the clock output of the processor 15, the divider 24 includes its own clock (crystal controlled, as illustrated). Thus, the independent divider clock is effective to check drift of the processor clock. Typical tolerance for the crystals is 0.01%, and if we assume that the nominal output frequency is 1 kHz., then the 0.01% offset produces a 0.1 Hz beat frequency. While this is low enough to pick the relay, it does introduce a 5 second uncertainity. This is effectively reduced by intentionally separating the frequencies of the two output waveforms at their nominal frequencies by 1 Hz. Under those circumstances, the 0.01% results in a beat frequency in the range of 0.9 Hz. to 1.1 Hz. at a 1 kHz. nominal frequency. The time delay uncertainty under these circumstances is only 0.5 seconds. In summary, the divider crystal is selected such that the divider output is 1001 Hz. while the processor output, under proper conditions, is 1 kHz., giving a nominal beat of 1 Hz.

Figure 5A:
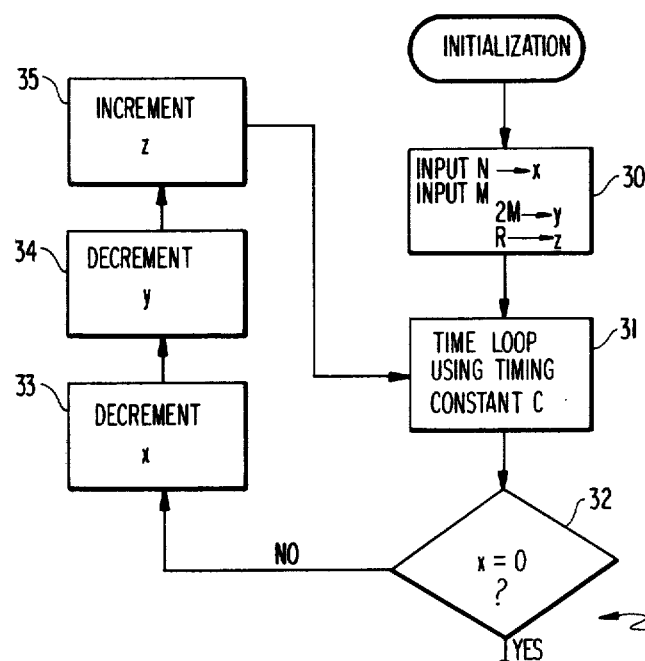
FIGS. 5A and 5B are flow charts illustrating software routines employed with the illustrated apparatus.
Figure 5B:
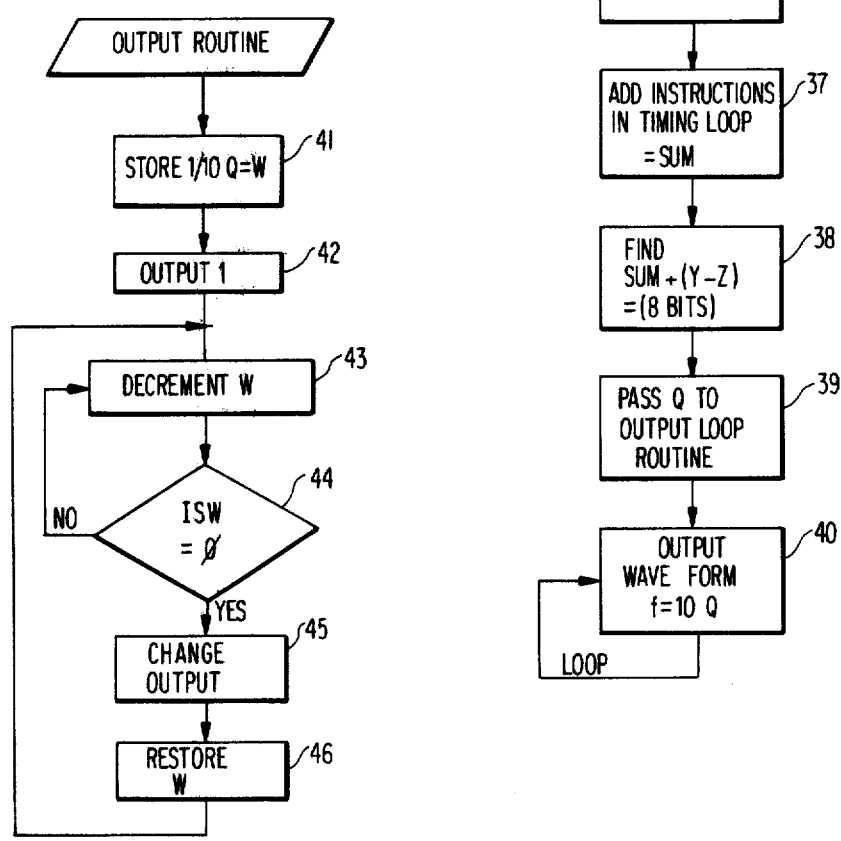

FIGS. 5A and 5B illustrate an example of a program of instructions which, when used with the apparatus shown in FIGS. 1 and 2 and/or 3, will produce the desired predetermined time delay.

As shown in FIG. 5, the program of instructions begins after the initialization produced by powering the processor 15. As shown, the first step 30 inputs the number N and stores it in the x register, the number M is also input and twice that number (2M) is stored in the y register. A constant R (which may be stored in the read only memory) is stored in a z register. The next step 31 can be any instruction which is arranged to consume a predetermined number of clock cycles. For example, a further constant can be read from the read only memory, stored in a register, and then decremented once per clock cycle until the quantity has been decremented to zero. Those skilled in the art will be able to substitute still other techniques for step 31.

Decision point 32 determines whether x (that is, the quantity stored in the x register) is zero. Inasmuch as it has just been loaded with the number N, at this point in time, it would not be. Accordingly, functions 33–35 are performed. More particularly, the x register and y register are decremented and the z register is incremented. Function 31 is again performed and the decision point 32 determines whether the x register has yet reached zero. It should be apparent that the loop of functions 31–35 are completed N times (and the step 31 is performed N+1 times) before the x register is decremented to zero. At that point in time, the y register will contain the quantity 2M-N and the z register will contain the quantity R+N. Function 36 then determines the difference between the quantities in the y and z registers. The number N was selected to provide a sufficient number of timing loops to give the desired delay, the remaining quantities are selected to give a predetermined result at steps 36. In order to check that the instruction program has been properly executed, step 37 sums each of the instructions in the timing loop, treating each instruction as a numeric quantity. Function 38 adds the sum produced in step 37 with the difference produced in step 36; the result is the quantity Q. Function 39 passes the quantity Q to an output loop routine 40 which produces a waveform having a frequency 10Q.

One embodiment of the output routine is shown in more detail in FIG. 5B, although those skilled in the art will be able to employ different steps to perform the same function. As shown, the first step is to determine a quantity W equal to the reciprocal of 10Q. Step 42 then drives the output high, and this is the beginning of the output waveform. Step 43 decrements the quantity Q and decision point 44 determines if W has been decremented to zero. If it has not, step 42 is repeatedly performed until the quantity W has been decremented to zero. At that point, step 45 changes the output, i.e., if a one had been output, a zero is now output, and vice versa. Step 46 restores the original quantity W and loops back to step 42. By continuously changing the output at pin 1 from logic 1 to 0, as the quantity W is decremented to zero, and output waveform is built whose frequency is equal to 10Q.

The foregoing is considered an adequate disclosure of a feature of the invention to enable those skilled in the art to make and use the invention. The following description, related to FIG. 4, describes implementation of a specific embodiment. Those skilled in the art will perceive other further specific implementations which are considered equivalent.

Figure 4:
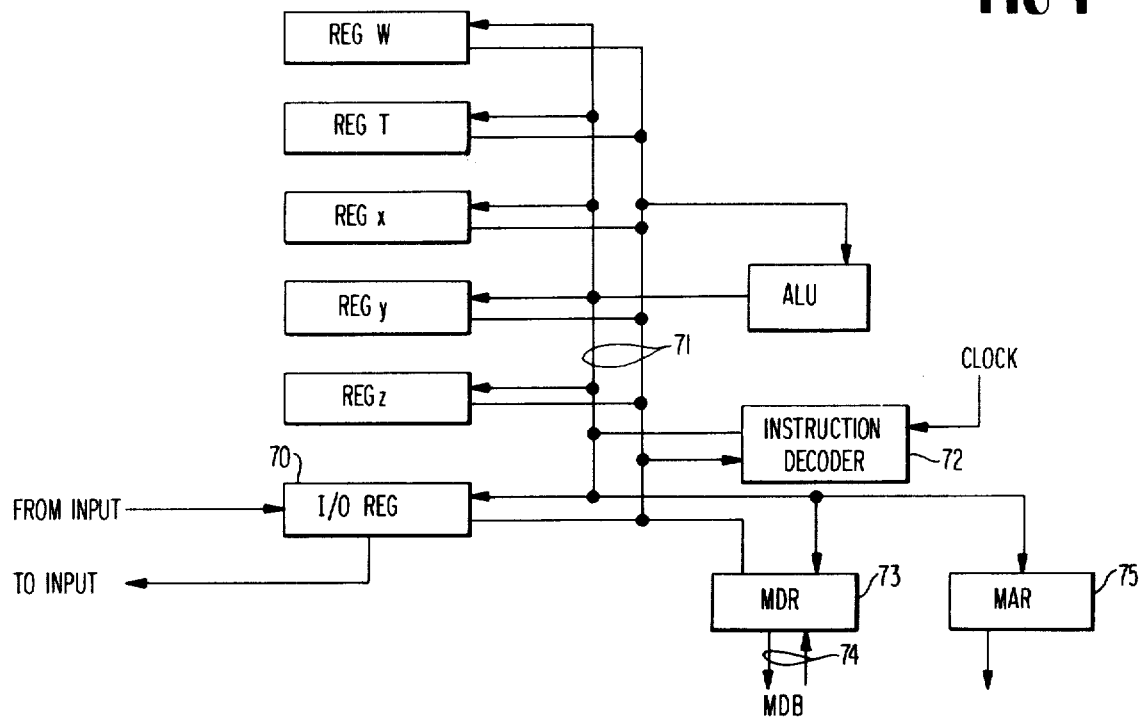
FIG. 4 is a block diagram of the microprocessor useful in explaining the operation.

FIG. 4 is a block diagram of the microprocessor showing its relevant components to explain how the program is actually carried out. Included are registers x, y and z, an I/O register 70 which may receive information from an input, and control an output. A bi-directional bus 71 couples the registers to an arithmetic logic unit (ALU) and instruction decoder 72 and a memory data register 73 which in turn is coupled to a bi-directional memory data bus 74, and thence to the ROM 17. In addition, a memory address register 75 is provided to properly address the ROM.

When the processor 15 is initialized, the instruction decoder 72 causes the memory address register to read the first address of the ROM which is decoded to enable the I/O register 70 to read in the quantities M and N from the external registers 18 and 19. As mentioned, the quantity N is stored in the x register, the quantity M is doubled in the arithmetic logic unit (ALU), and stored in the y register. The next program instruction causes the memory address register to read out a selected memory location storing the quantity R which is coupled through the memory data register 73 to the register z. Further instructions read from the ROM cause the ALU to perform the arithmetic functions 33, 34 and 35, as well as the function 32. The timing loop 31 can be implemented by reading a quantity from ROM 17 storing it in register T and decrementing the quantity, once per clock count in ALU and terminating the loop on decrementing the T register to zero. This will consume a predetermined number of clock counts and therefore, at least nominally, a predetermined unit time. When the quantity in the x register has been determined to be zero, the ALU is instructed to find the difference between the quantities in the y and z registers. In a like fashion, the ALU is instructed by the instruction decoder, reading the next program instruction to sum a number of quantities which are the instructions defining the loop 31-35. The ALU is further controlled by the instruction decoder to perform the function 38 and then skip to the output routine, which is stored in a defined area in the ROM. In like fashion, the functions shown in FIG. 5B are performed with the same apparatus. For example, the ALU determines from Q the quantity 1/10Q which is stored in the Q register, which is then decremented as shown in FIG. 5B. Those skilled in the art will understand that some or all of the registers x, y, z, T and W may be reused and/or may actually be reserved areas in RAM.

In a preferred embodiment, the inventive delay circuit is capable of timing periods ranging from 2 seconds to 8 minutes, in 2 second increments, when powered with a voltage between 10 and 15 volts within a temperature range of −40 to +85° C. To achieve this capability, function 31 is arranged to consume 2 seconds for each pass. Each time the loop of functions 31-35 is performed, the x and y registers are decremented and the z register is incremented. When the x register contains the quantity zero, N 2 second intervals will have elapsed and y will equal 2M minus N, z will equal R+N. The difference (y−z) is added to the sum of timing loop instructions giving the result Q. Q is then passed to the output routine where it is multiplied by 10 and produces a 50% duty cycle squarewave.

The quantity M and N can be selected employing well known techniques so as to make more effective conventional error checking techniques. For example, they may be selected so that the minimum number of bit reversals required to change one acceptable bit combination into a new set is at a maximum. For example, if M=N, this number of bit reversals is 2; on the other hand, if M=N+5, the minimum number of bit reversals is 3.

As mentioned above, when the processor is operating correctly, it will produce a squarewave output, for example at 1 kHz. Preferably, output of the divider is nominally slightly different from 1 kHz., for example, by 1 Hz. Under these circumstances, FIG. 6 shows the output available at the capacitor C, with the period of the groups of positive and negative pulses at 500 msec. each. A typical biased neutral relay which can implement relay 10 must be energized for at least 300 msec. before it will pick, and thus, the negative portion will serve to energize the relay. However, if as a result of the processor operation Q is not correct, but only differs by a small amount from the correct number, the relay may still be picked. The multiplication by 10 provides that if the number Q produced by the processor is even 1 bit off, the resulting frequency will be at least 10 Hz. away from the desired frequency. Under those circumstances, as illustrated in FIG. 6, the pulse period produced at the capacitor will be on the order of 50 msec., inadequate to pick the relay.

Figure 7:
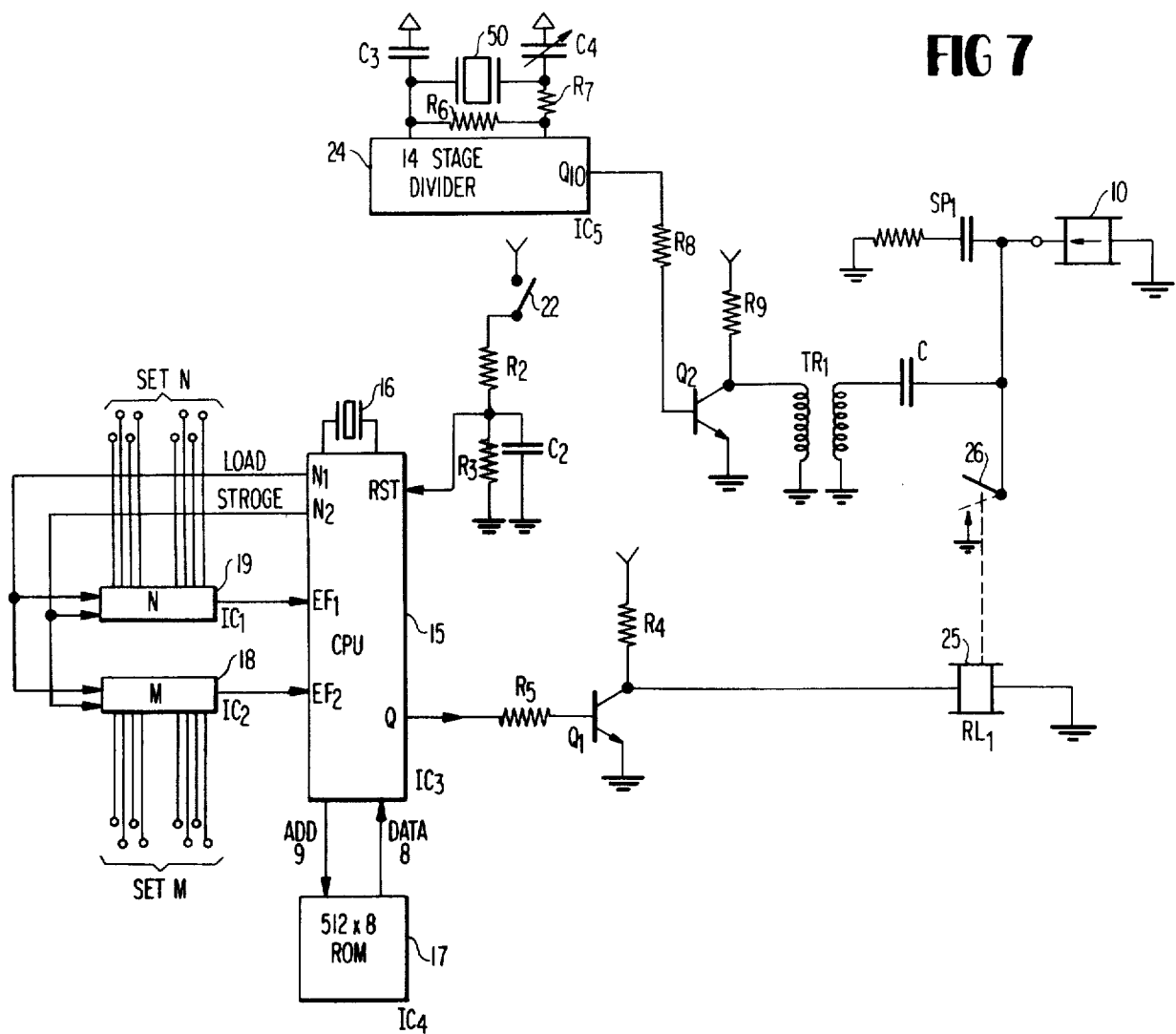
FIG. 7 is a block diagram of a practical embodiment of the invention.

FIG. 7 illustrates a practical arrangement, which is substantially similar to FIG. 3 except that the output of the processor at pin 1 is amplified by Q1 in order to operate the relay 25. Relay 25 may be replaced by an active solid state device so long as the replacement does not have any self-rectifying failure modes.

Amplification is provided for the output of the divider 24, by a transformer coupled amplifier Q2. The amplification here is at least a factor of 2 so that the nominal 12 volt relay 10 can be picked when the supply voltage is a minimum of 10 volts.

Figure 8:
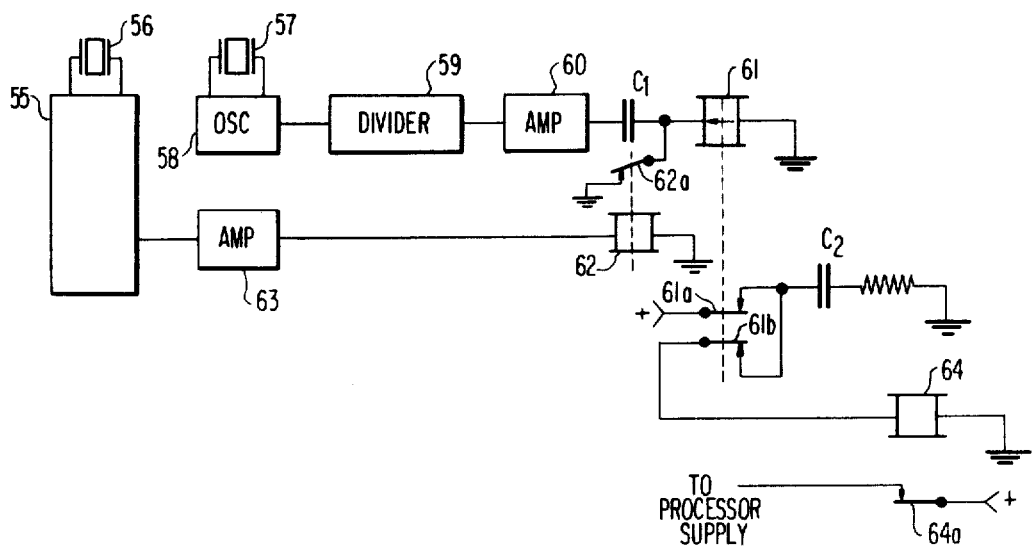
FIG. 8 illustrates one particular utility for the clock generating circuitry.

Another characteristic of the invention employs the checking capabilities, as shown in FIG. 2, or preferably FIG. 3, to verify proper operation of the processor such as a microprocessor. In the embodiment illustrated in FIGS. 1-3, the output of the processor, at pin 1, was produced as a result of arithmetic or logic computation, and was also dependent upon the clock frequency of the processor established by the crystal 16. In this embodiment of the invention, computation may or may not be carried out by the processor, and it is merely desired to check the proper frequency of the clock as determined by a crystal. As shown in FIG. 8, a processor such as microprocessor 55 is operated at a predetermined rate by a clock circuit whose frequency is determined by a crystal 56. An output signal, for example, a squarewave at the operating frequency of the processor, is provided by an amplifier 63 to a relay 62. In addition, an oscillator 58 driven at a frequency determined by a crystal 57 produces a squarewave which is provided to a divider 59 which divides frequency by a predetermined amount, and couples an output signal through an amplifier 60 to one terminal of a capacitor C1 whose other terminal is connected to a biased neutral relay 61. The relay is selected to be energized by direct current of a polarity not otherwise available. This polarity is produced at the capacitor C1 whose output is rectified by the form B contact 62a of the relay 62. The crystal 57 and the divider 59 are arranged so that when the processor 55 is operating at the correct frequency, there is a predetermined relationship between the squarewave frequency operating the relay 62 and that provided to the capacitor C1. Preferably, these frequencies differ by a small amount such as 1 Hz. Under such conditions, the biased neutral relay 61 will pulsate. A form A contact 61a of the relay 61 couples a positive potential to a charging circuit for a capacitor C2. The capacitor C2 is connected to a form B contact of the relay 61b to energize a slow drop-away relay 64. A form A contact 64a of the relay 64 couples a positive source of potential to the processor supply.

In typical operation, the processor is energized by a circuit (not shown) which is completed for a short period of time (for example, 5 seconds). Assuming that the processor 55 is operating at the correct frequency, the pulsating action at the relay 61 will maintain the slow drop-away 64 energized to thereafter supply operating power for the processor when its initialization circuit is broken. However, this power supply circuit will only be completed if the processor is operating at the correct frequency.

The output provided to amplifier 63, indicative of the frequency of operation of the processor 55 may be derived directly from the processor clock, or the processor can be caused to carry out a series of computations, similar to those disclosed above, so that the correct frequency is only achieved in the conjunction of the proper operating frequency of the processor 55 and the proper result of the computations.

Those skilled in the art will realize that many changes can be made to the invention disclosed herein, for example, the circuit including the capacitor C2 which converts the pulsating action of the form A contact 61a into energization of the slow drop-away relay 64 can be changed by substituting therefor other conventional circuits to convert the pulsating action of a contact into direct current. In addition, for safety reasons, it may be desirable to produce direct current of a polarity not otherwise available in the circuit to energize the relay 64 so that the short circuits and the like will not energize the relay.

What is claimed is:

1. Apparatus for verifying proper clock frequency of a processor comprising:
    a clock driven processor including output means to generate a signal with frequency related to clock frequency and alternating between two potential levels,
    a potential responsive device coupled to said signal and including switching means operated to make and break a circuit to a selected potential dependent on said signal,
    checking means including means for generating a checking signal with predetermined frequency alternating between two potential levels,
    capacitive means coupled between said switching means and said means for generating said checking signal and,
    a dc load coupled to said switching means,
    whereby pulsating dc is delivered to said load with the period of dc pulses related to the difference between said clock frequency and said predetermined frequency.

2. The apparatus of claim 1 in which said processor includes a crystal for determining clock frequency and said checking means includes a further crystal for determining said predetermined frequency with said crystals selected to produce frequencies of said signal and checking signal which are slightly different.

3. The apparatus of claim 2 in which said frequencies differ by nominally 1 Hz.

4. The apparatus of claim 1 in which said processor comprises a microprocessor.
    said checking means includes a counter,
    said potential responsive device comprises a relay and said switching means comprises a contact of said relay, and
    said dc load comprises a biased neutral relay.

5. The apparatus of claim 4 which further includes a contact of said biased neutral relay and final means responsive to pulsating operation of said contact for completing a circuit to supply power to said microprocessor.

6. The apparatus of claim 5 wherein
    said final means includes a slow release relay with a front contact connected between a power input of said microprocessor and a source of energy.
    a capacitor coupled to a first potential and through a front contact of said biased neutral relay to a different potential.

7. The apparatus of claim 6 in which said checking means counter is driven by a crystal controlled oscillator.

8. The apparatus of claim 7 in which said microprocessor includes a crystal for determining clock frequency with both said crystals selected to produce frequencies of said signal and checking signal which are slightly different.

9. The apparatus of claim 8 in which said frequencies differ by nominally 1 Hz.

10. A vital time delay circuit for energizing load means no less than a predetermined time after an input stimulus comprising
    a processor coupled to be initiated by said stimulus,
    input means responsive to said initiation for loading at least one quantity into a register of said processor,
    program responsive means for performing a series of computations with said at least one quantity to produce an output quantity,
    said program responsive means including means for consuming a unit of time for each of said series of computations and for terminating said computations after a number of computations related to said at least one quantity,
    output means for outputting a signal alternating between two potential levels at a rate determined by said output quantity, but only after completion of said series of computations, and
    rate checking means for comparing said rate with a checking rate and for energizing said load means if and only if said rates bear a predetermined relationship, whereby the time consumed in said series of unit times provides said predetermined time delay.

11. The apparatus of claim 10 in which two quantities are loaded into registers of said processor in response to said stimulus.

12. The apparatus of claim 10 in which said checking means includes a counter driven by a clock output of said processor and further includes:
    a capacitor coupled to an output of said counter and to said load means, said load means energized by pulsating dc of pulse period equal to or greater than a minimum period.

13. The apparatus of claim 12 in which said checking means further includes
    switching means also coupled to said load means and switched to make and break a circuit to a selected potential in accordance with said signal.

14. The apparatus of claim 13 in which said signal rate and said checking rate are nominally slightly different.

15. The apparatus of claim 14 wherein said rates differ by nominally 1 Hz.

16. The apparatus of claim 10 in which said rate checking means derives said checking rate from a clock signal produced in said processor.

17. The apparatus of claim 10 in which said rate checking means includes an oscillator for producing said checking rate.

18. The apparatus of claim 17 in which a counter is included in said rate checking means and coupled to said oscillator and which further includes
    a capacitor coupled to an output of said counter,
    said load means energized by pulsating dc of pulse period equal to or greater than a minimum period and coupled to said capacitor, and
    switching means also coupled to said load means and switched to make and break a circuit to a selected potential in accordance with said signal.

19. The apparatus of claim 18 wherein said signal rate and said checking rate are slightly different.

20. The apparatus of claim 10 in which at least two quantities are loaded into registers of said processor in response to said stimulus and in which said program responsive means includes, means for arithmetically operating on said two quantities and for also decrementing at least one of said quantities and repeating said operations until said decremented quantity reaches a predetermined level, and means for consuming a time unit for each said operation.

21. The apparatus of claim 20 in which said program responsive means further includes:

means for summing a selected group of instructions and for adding the result to the quantity generated by said arithmetically operating means, said output means responsive to the quantity produced by said means for summing.

* * * * *

UNITED STATES PATENT AND TRADEMARK OFFICE
CERTIFICATE OF CORRECTION

PATENT NO. : 4,168,526
DATED : September 18, 1979
INVENTOR(S) : AUER, John H., et al It is certified that error appears in the above—identified patent and that said Letters Patent are hereby corrected as shown below:

In the title, please change "Relay" to --Delay--.

The title should read "DIGITAL CIRCUIT GENERATING A VITAL DELAY".

Signed and Sealed this

First Day of April 1980

[SEAL]

Attest:

SIDNEY A. DIAMOND

Attesting Officer

Commissioner of Patents and Trademarks